(12) United States Patent
Yamada

(10) Patent No.: US 7,554,643 B2
(45) Date of Patent: Jun. 30, 2009

(54) ELECTRO-OPTICAL DEVICE, ELECTRONIC APPARATUS, AND INTERFACE BOARD

(75) Inventor: Kazuyuki Yamada, Matsumoto (JP)

(73) Assignee: Epson Imaging Devices Corporation (JP)

( * ) Notice: Subject to any disclaimer, the term of this patent is extended or adjusted under 35 U.S.C. 154(b) by 527 days.

(21) Appl. No.: 11/515,929

(22) Filed: Sep. 6, 2006

(65) Prior Publication Data

US 2007/0052904 A1   Mar. 8, 2007

(30) Foreign Application Priority Data

Sep. 6, 2005   (JP) ............................. 2005-257607

(51) Int. Cl.
   *G02F 1/1345* (2006.01)
(52) U.S. Cl. ........................ 349/150; 349/149; 349/151; 349/152
(58) Field of Classification Search .................. 349/150, 349/149, 151, 152
   See application file for complete search history.

(56) References Cited

U.S. PATENT DOCUMENTS 6,836,310 B2 * 12/2004 Yamazaki et al. ........... 349/150

FOREIGN PATENT DOCUMENTS

| JP | 59-173357 | 11/1984 |
|----|-----------|---------|
| JP | 62-271493 | 11/1987 |
| JP | 64090587  | 4/1989  |
| JP | 07-202357 | 8/1995  |
| JP | 09-298626 | 11/1997 |
| JP | 11-186674 | 7/1999  |
| JP | 11298094  | 10/1999 |
| JP | 11316554  | 11/1999 |
| JP | 2001-036202 | 2/2001 |
| JP | 2002063958 | 2/2002  |
| JP | 2003-017817 | 1/2003 |
| JP | 2003-115706 | 4/2003 |
| JP | 2003133659 | 5/2003  |
| JP | 2003-224408 | 8/2003 |
| JP | 2003-347693 | 12/2003 |
| JP | 2004-063958 | 2/2004 |
| JP | 2004-088020 | 3/2004 |
| JP | 2004-096047 | 3/2004 |
| JP | 2004-221345 | 8/2004 |
| JP | 2005-208481 | 8/2005 |
| JP | 2005-222001 | 8/2005 |

* cited by examiner

*Primary Examiner*—David Nelms
*Assistant Examiner*—David Y Chung
(74) *Attorney, Agent, or Firm*—Lowe Hauptman Ham & Berner, LLP

(57) ABSTRACT

An electro-optical device includes an electro-optical panel, and an interface board through which an image display signal is supplied to the electro-optical panel. The interface board includes a flexible film board, a plurality of terminals that are disposed on the film board, a plurality of wiring lines that are disposed on one surface of the film board and that are electrically connected to the terminals, respectively, and a first conductive member that is formed on the other surface of the film board and that is grounded. The first conductive member overlaps at least one of the wiring lines when the film board is seen in plan view, and the first conductive member is formed along the one wiring line.

8 Claims, 10 Drawing Sheets

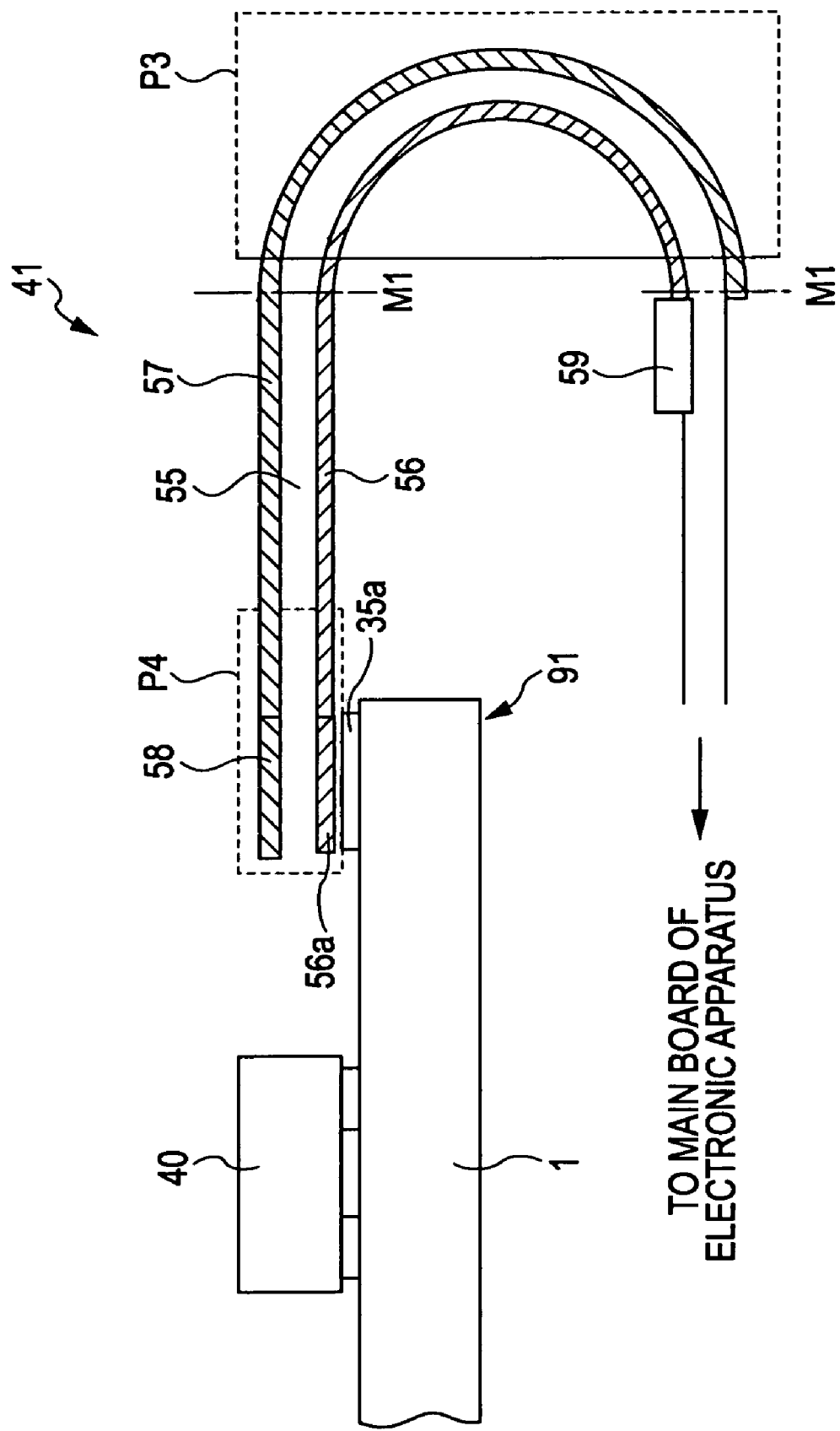

ELECTRO-OPTICAL DEVICE, ELECTRONIC APPARATUS, AND INTERFACE BOARD

RELATED APPLICATION

The present application is based on, and claims priority from, Japanese Application No. 2005-257607(P), filed Sep. 6, 2005, the disclosure of which is hereby incorporated by reference in its entirety.

BACKGROUND

1. Technical Field

The present invention relates to an electro-optical device that has a flexible interface board.

2. Related Art

In general, an electro-optical device has a structure in which electro-optical materials, such as liquid crystal, are interposed between two substrates. Further, an electro-optical device includes wiring lines, such as gate lines or source lines, which drive the electro-optical materials thereof for every pixel, and a driver IC that supplies driving signals to the wiring lines on the basis of the image display signals supplied from a control device.

As an interface board for electrically connecting a main board for controlling an electronic apparatus and an electro-optical device, an FPC (Flexible Printed Circuit) has been used. The electro-optical device receives image display signals through the FPC. The FPC corresponds to a flexible printed circuit board upon which wiring lines and circuits necessary for display driving control are formed. In recent years, high-speed data transmission through the FPC has been increasingly required.

In JP-A-2004-96047, a method of installing an FPC on an electro-optical device is disclosed.

However, when high-speed data transmission is performed, it is difficult for a high-frequency signal to be stabilized so as to be transmitted through the FPC.

SUMMARY

An advantage of some aspects of the invention is that it provides an electro-optical device capable of stabilizing a high-frequency signal and transmitting the high-frequency signal through an FPC.

According to a first aspect of the invention, a liquid crystal display device includes an electro-optical panel and an interface board through an image display signal is supplied to the electro-optical panel. The interface board has a flexible film board, a plurality of terminals that are disposed on one surface of the film board, a plurality of wiring lines that are disposed on the one surface of the film board and that are electrically connected to the plurality of terminals, and a first conductive member that is formed on the other surface of the film board and that is coupled with ground wiring lines. Further, the first conductive member overlaps at least one wiring line among the plurality of wiring lines in plan view, and the first conductive member is formed along the at least one wiring line.

In this case, the electro-optical device according to the first aspect of the invention corresponds to a liquid crystal display device, and includes the electro-optical panel and the interface board. In the electro-optical device according to the first aspect of the invention, the image display signal is supplied to the electro-optical panel through the interface board. At this time, the electro-optical panel corresponds to a liquid crystal display panel. The interface board corresponds to an FPC (Flexible Printed Circuit). The interface board includes a flexible film board, the plurality of terminals, the plurality of wiring lines, and the first conductive member. The film board corresponds to a base film of the FPC, and it is composed of a flexible plastic film, such as, for example, a polyimide resin, an epoxy resin, or the like. The plurality of terminals are disposed on one surface of the film board. Further, the plurality of wiring lines correspond to wiring lines that are patterned in the FPC. The plurality of wiring lines are disposed on the one surface of the film board and electrically connected to the plurality of terminals. The first conductive member corresponds to a metallic film that is formed of copper (Cu) or the like. The first conductive member overlaps at least one wiring line among the plurality of wiring lines in plan view, and it is formed on the other surface of the film board along the at least one wiring line. Further, the first conductive member is coupled with the ground wiring line and has a potential that is always set to 0 V. In this way, it is possible to suppress a loss of a high-frequency signal flowing into the wiring line in which the metallic film is formed along the corresponding wiring line, which results in performing stable data transmission.

The width of the first conductive member may be at least three times the width of the one wiring line. Therefore, it is possible to surely prevent the loss of the high-frequency signal occurring when the high-speed data transmission is performed.

First and second wiring lines among the plurality of wiring lines may be used for transmitting differential signals in a differential transmission mode, the first wiring line transmits a plus signal generated from one signal, the second wiring line transmits a minus signal that is an inversion signal of the plus signal, and the first conductive member overlaps the first wiring line and the second wiring line in plan view, and the first conductive member is formed along the first wiring line and the second wiring line.

The electro-optical device according to the first aspect of the invention may further include a second conductive member that is formed on the other surface of the film board so as to override the plurality of terminals. The second conductive member may come into contact with the first member. The second conductive member corresponds to a metallic film that is formed of copper (Cu), and it is formed on the other surface of the film board so as to override the plurality of terminals. Further, the second conductive member comes into contact with the first conductive member such that its potential is always set to 0 V. Thereby, the loss of the high-frequency signal can be prevented. In addition, when the FPC is pressurized against the element substrate of the electro-optical device through the ACF (Anisotrophic Conductive Film) so as to be bonded to the element substrate, the FPC can be uniformly pressed, and the element substrate and the FPC can be surely bonded to each other. Further, since the second conductive member has higher thermal conductivity than a cover member, even though the peak temperature when the ACF is heated is lowered, the sufficient heat can be transmitted to the ACF when the element substrate and the FPC are bonded.

The second conductive member may be formed so as to be offset inner than one end of the film board. Thereby, it can be prevented that the second conductive member comes into contact with the plurality of terminals, and thus the short circuit occurs.

According to a second aspect of the invention, an electronic apparatus includes the electro-optical device described above as a display unit.

According to a third aspect of the invention, an interface board includes a flexible film board, a plurality of terminals that are disposed on one surface of the film board, a plurality of wiring lines that are disposed on the one surface of the film board and that are electrically connected to the plurality of terminals, and a first conductive member that is formed on the other surface of the film board and that is coupled with ground wiring lines. Further, the first conductive member overlaps at least one wiring line among the plurality of wiring lines in plan view, and the first conductive member is formed along the one wiring line. Thereby, the loss of the high frequency component of the signal flowing through the wiring line can be suppressed, and the data transmission can be stably performed.

The interface board according to the third aspect of the invention may further include a second conductive member that is formed on the other surface of the film board and that is formed so as to override the plurality of terminals. The second conductive member may come into contact with the first conductive member. Thereby, the loss of the high-frequency signal can be prevented. In addition, when the FPC is pressurized against the element substrate of the electro-optical device so as to be mounted thereon, the FPC can be uniformly pressed, and the element substrate and the FPC can be surely bonded to each other.

BRIEF DESCRIPTION OF THE DRAWINGS

The invention will be described with reference to the accompanying drawings, wherein like numbers reference like elements.

FIG. 7 is a lateral view of an FPC.

DESCRIPTION OF EXEMPLARY EMBODIMENTS

Hereinafter, the preferred embodiments of the invention will be described with reference to the accompanying drawings.

Structure of Liquid Crystal Display Device

First, a structure of a liquid crystal display device 100 according to an embodiment of the invention will be described with reference to FIG. 1 or 2.

Figure 1:
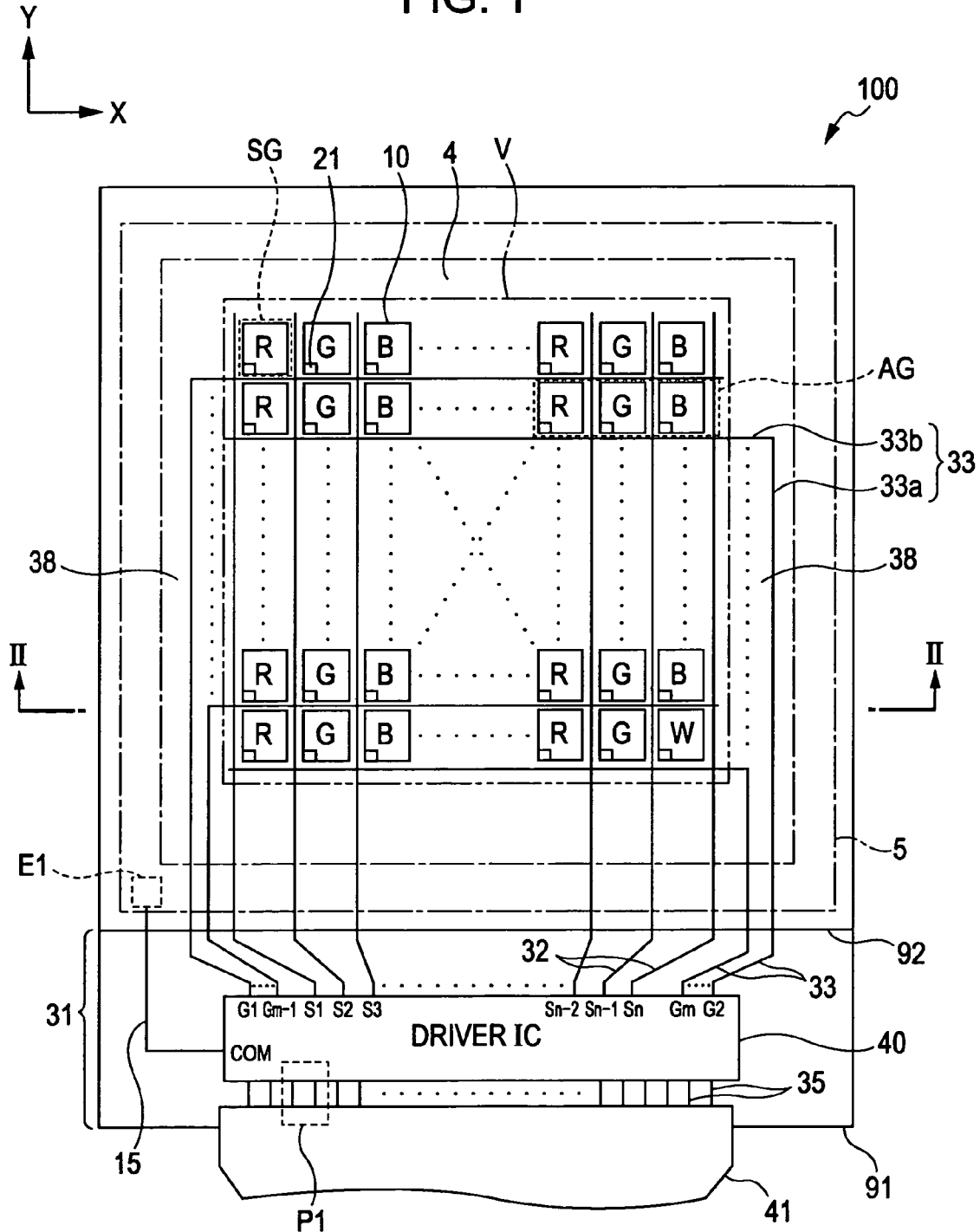
FIG. 1 is a plan view illustrating a structure of a liquid crystal display device according to an embodiment of the invention.

FIG. 1 is a plan view schematically illustrating a structure of a liquid crystal display device 100 according to an embodiment of the invention. FIG. 2 is an enlarged cross-sectional view taken along the line II-II in the liquid crystal display device 100 shown in FIG. 1. As shown in FIG. 1, an element substrate 91 is disposed to the rear of a color filer substrate 92. In FIG. 1, a longitudinal direction of the drawing (column direction) is defined as a Y direction, and a horizontal direction of the drawing (row direction) is defined as an X direction. In addition, in FIG. 1, each of the regions corresponding to R (red), G (green), and B (blue) indicates one sub-pixel region SG, and sub-pixel regions SG of one row and three columns that correspond to R, G, and B indicate one pixel region AG.

Figure 2:
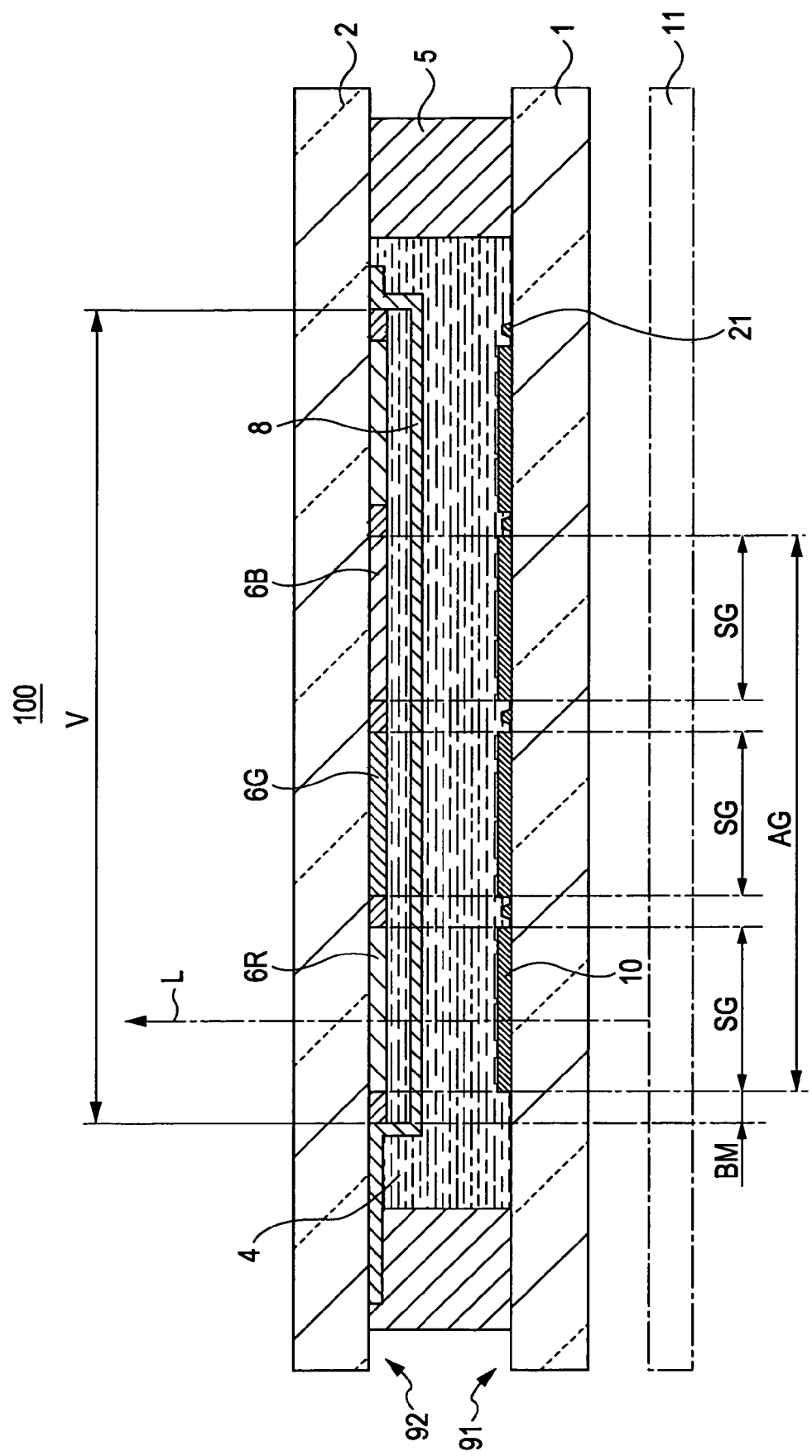
FIG. 2 is a cross-sectional view illustrating a structure of a liquid crystal display device according to an embodiment of the invention.

As shown in FIG. 2, the liquid crystal display device 100 includes the element substrate 91 and the color filter substrate 92 that is disposed so as to be opposite to the element substrate 91. The element substrate 91 and the color filter substrate 92 are bonded to each other through a sealant 5 having a frame shape. Liquid crystal is injected inside the sealant 5 so as to form a liquid crystal layer 4. On an external surface of the element substrate 91, an illumination device 11 is provided. The illumination device 11 emits light L toward the element substrate 91. The light L is transmitted through the element substrate 91, the liquid crystal layer 4, and the color filter substrate 92, so that the liquid crystal display device 100 is illuminated. Thereby, the liquid crystal display device 100 can display images, such as characters, figures, diagrams, or the like.

In this case, the liquid crystal display device 100 corresponds to a liquid crystal display device for color display which is constructed by using three primary colors including R, G, and B and an active-matrix-driven liquid crystal display device that uses a-Si TFT (Thin Film Transistor) elements serving as switching elements.

First, a planar structure of the element substrate 91 will be described. On an inner surface of the element substrate 91, a plurality of source lines 32, a plurality of gate lines 33, a plurality of a-Si TFT elements 21, a plurality of pixel electrodes 10, a driver IC 40, external connection wiring lines 35, an FPC (Flexible Printed Circuit) 41, or the like are mainly formed or mounted.

As shown in FIG. 1, the element substrate 91 has an extending region 31 that extends from one side of the color filter substrate 92 to the outside, and the driver IC 40 is mounted on the extending region 31. An input-side terminal (not shown) of the driver IC 40 is electrically connected to one end of each of the plurality of external connection wiring lines 35, and the other end of each of the plurality of external connection wiring lines 35 is electrically connected to the FPC. The corresponding source lines 32 are formed such that they extend in a Y direction at predetermined intervals in an X direction, and one end of each of the source lines 32 is electrically connected to an output-side terminal (not shown) of the driver IC 40.

Each of the gate lines 33 has a first wiring line 33a that is formed so as to extend in a Y direction, and a second wiring line 33b that is formed so as to extend in an X direction from a terminating portion of the first wiring line 33a. The second wiring lines 33b of the corresponding gate lines 33 are formed such that they extend in a direction crossing the corresponding source lines 32, that is, an X direction, at predetermined intervals in a Y direction. One end of the first wiring line 33a of each of the gate lines 33 is electrically connected to an output-side terminal (not shown) of the driver IC 40. Further, the TFT element 21 is provided at a location corresponding to an intersection between each source line 32 and the second wiring line 33b of each gate line 33, and each TFT element 21 is electrically connected to each source line 32, each gate line 33, and each pixel electrode 10. Each TFT element 21 and each pixel electrode 10 are provided at locations corresponding to each sub-pixel region SG on the substrate 1 made of glass or the like. Each pixel electrode 10 is formed of a transparent conductive material, such as, for example, ITO (Indium-Tin Oxide) or the like.

An effective display region V (a region surrounded with two-dot chain lines) corresponds to a region where a plurality of pixel regions AG are disposed in a matrix in an X direction and a Y direction. In the effective display region V, images, such as characters, figures, diagrams, or the like, are displayed. Further, a region outside the effective display region V forms a frame region 38 that is not related to display. Furthermore, on the inner surfaces of each source line 32, each gate line 33, each TFT element 21, each pixel electrode 10, or the like, an alignment film (not shown) is formed.

Next, a planar structure of the color filter substrate 92 will be described. As shown in FIG. 2, this color filter substrate 92 has a light-shielding layer (it is generally referred to as a 'black matrix', and in the description below, it is simply referred to as 'BM'), colored layers 6R, 6G, and 6B of three colors including R, G, and B, a common electrode 8, or the like, which are formed on the substrate 2 made of glass or the like. In this case, the BM is formed at a location that partitions the corresponding sub-pixels SG. Similar to the pixel electrode, the common electrode 8 is formed of a transparent conductive material, such as an ITO or the like, and it is provided over substantially an entire surface of the color filter substrate 92. In a region E1 of a corner of the sealant 5, the common electrode 8 is electrically connected to one end of the wiring line 15, and the other end of the wiring line 15 is electrically connected to an output terminal that corresponds to COM of the driver IC 40.

In the liquid crystal display device 100 having the above-described structure, the gate lines 33 are sequentially and exclusively selected one by one by the driver IC 40 in the order of G1, G2, . . . , Gm-1, and Gm (m is a natural number) on the basis of power and a signal from the side of the FPC 41 that is connected to a main board of the electronic apparatus or the like, and the selected gate lines 33 are provided with a gate signal of a selected voltage while the other gate lines 33 that are not selected are supplied with a gate signal of the non-selected voltage. In addition, the driver IC 40 supplies a source signal according to display contents to the pixel electrodes 10 formed at locations corresponding to the selected gate line 33 through the corresponding source lines 32 of S1, S2, . . . , Sn-1, and Sn (n is a natural number) and the TFT elements 21. As a result, the state of the liquid crystal layer 4 is changed from a display state to a non-display state or an intermediate display state, and thus the alignment state of the liquid crystal layer 4 is controlled.

As shown in FIG. 2, the liquid crystal display device 100 according to this embodiment is exemplified as a complete transmissive liquid crystal display device, but the invention is not limited thereto. That is, a transflective liquid crystal display device may be used as the liquid crystal display device 100. Further, as shown in FIG. 1, the TFT element 21 is used as a switching element, but the invention is not limited thereto. As the switching element, a TFD (Thin Film Diode) element may be used instead of the TFT element 21.

Figure 3:
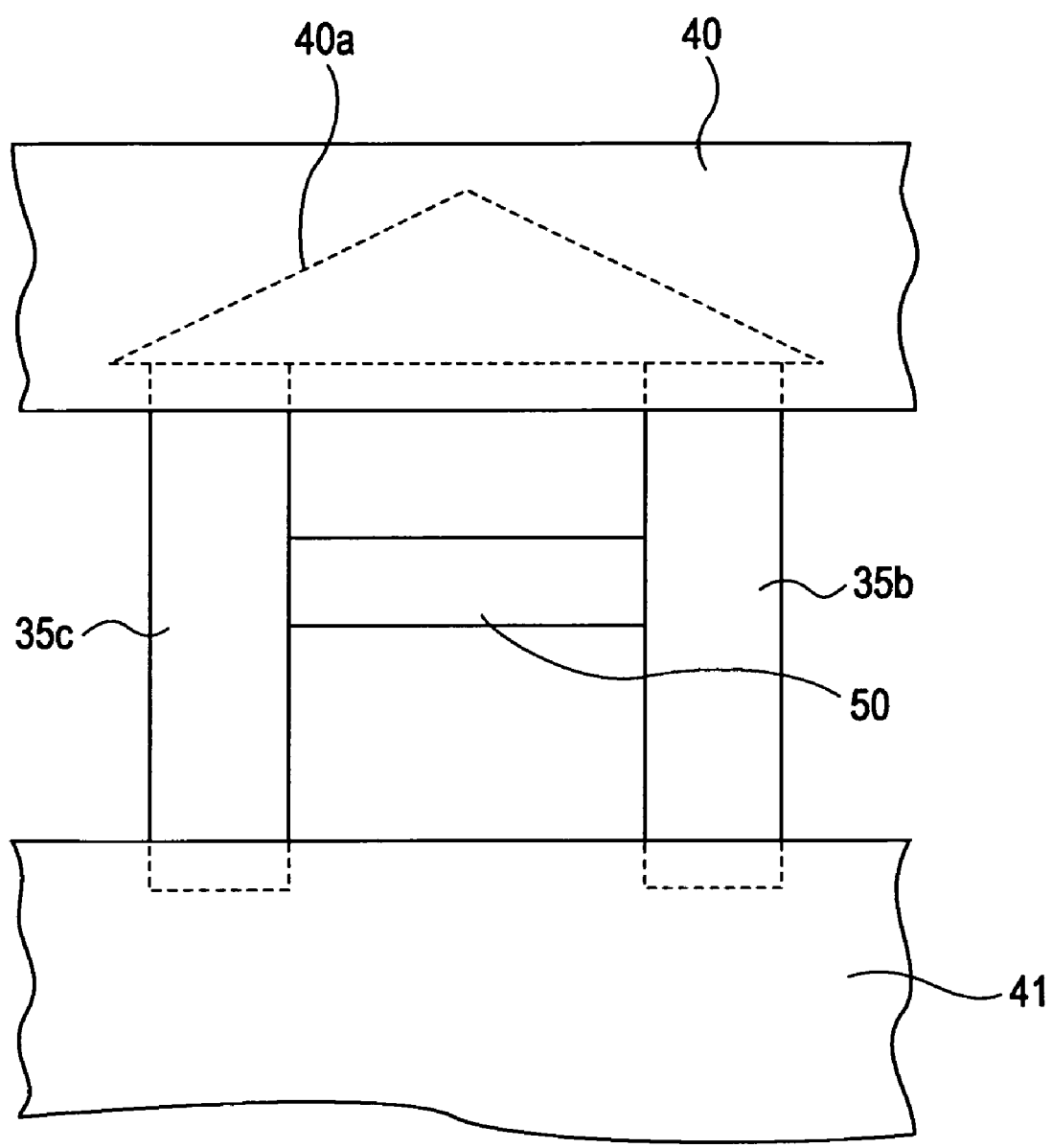
FIG. 3 is an enlarged view illustrating a driver IC and external connecting wiring lines 35.

FIG. 3 is an enlarged view of the driver IC 40 and the external connecting wiring lines 35, that is a portion surrounded by the broken lines P1 in FIG. 1.

An input side of the driver IC 40 is electrically connected to the external connecting wiring lines 35 through an ACF (Anisotrophic Conductive Film), and an output side of the driver IC 40 is electrically connected to the plurality of source lines 32, the plurality of gate lines 33, and the plurality of wiring lines 15 through the ACF. As shown in FIG. 3, the driver IC 40 has a receiver 40a. The receiver 40a receives a differential signal transmitted from the FPC 41 side in a differential transmitting method through a pair of external connecting wiring lines 35b and 35c. In this case, the differential transmitting method refers to a method in which two phase signals including a plus signal and a minus signal as an inversion signal of the plus signal are generated from one signal and then transmitted by using the two signal lines as a pair. By means of the differential transmitting method, high-speed data transmission can be performed at a low amplitude. When the data is transmitted by using the differential transmitting method, in order to prevent a waveform of the differential signal from being distorted, a termination resistor 50 is provided between the two signal lines to which the differential signals are input.

Structure of FPC

Figure 4:
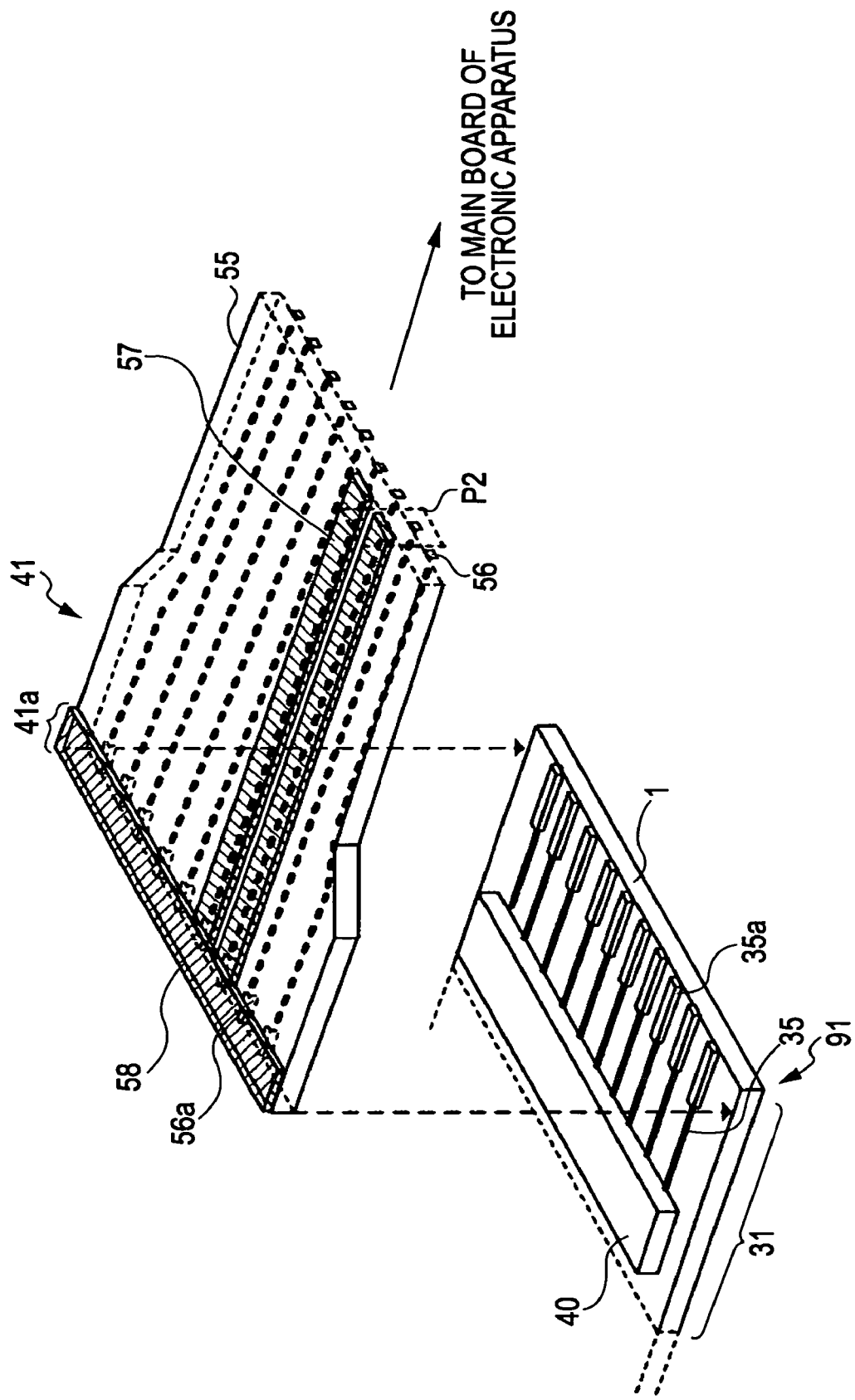
FIG. 4 is a diagram schematically illustrating an FPC and an element substrate.

Next, the structure of the FPC 41 according to the embodiment of the invention will be described in detail. FIG. 4 is a diagram schematically illustrating the FPC 41 and the extending region 31 of the element substrate 91 in accordance with the embodiment of the invention.

On the extending region 31 of the element substrate 91 in the liquid crystal display device 100, a plurality of terminals 35a are formed which are electrically connected to the external connecting wiring lines 35.

The FPC 41 is a flexible printed circuit board where circuits and wiring lines necessary for display driving control of the liquid crystal display device 100 are formed. As shown in FIG. 4, the FPC 41 mainly has a base film 55 that is made of a flexible plastic film, such as a polyimide resin or an epoxy resin, and wiring lines 56 (hereinafter, simply referred to as 'FPC wiring lines') that are formed on a surface of the base film 55 and patterned using a metal, such as copper (Cu). A terminal portion 41a that is connected to the element substrate 91 is provided with a plurality of terminals 56a that are electrically connected to the FPC wiring lines 56.

The other end of the FPC 41 (not shown) is provided with a plurality of terminals (not shown) that are connected to a main board of an electronic apparatus on which the liquid crystal display device 100 is mounted. Through these terminals, control signals required when image display is performed by the liquid crystal display device 100 or image data to be displayed is input to the FPC 41. In addition, on the FPC 41, various electronic components or a power supply IC for supplying power to the liquid crystal display device 100 is mounted.

The plurality of terminals 56a that are formed on the FPC 41 are electrically connected to the plurality of terminals 35a formed on the element substrate 91 of the liquid crystal display device 100 through the ACF. Thereby, the liquid crystal display device 100 is electrically connected to the FPC 41 and it is supplied with signals and power from the main board of the electronic apparatus or the like.

As shown in FIG. 4, the FPC 41 according to this embodiment has metallic films 57 and 58 that are patterned on a surface opposite to a surface where the FPC wiring lines 56 or the terminals 56a are formed. In this case, the metallic films 57 and 58 are patterned at predetermined gaps by using a metal, such as copper (Cu). The metallic film 57 overlaps at least one wiring line among the plurality of FPC wiring lines 56 in plan view, it being formed along the at least one wiring line. In the FPC 41 according to this embodiment, the metallic film 57 is patterned along any one of the plurality of FPC wiring lines 56, through which the above-described high-speed data transmission is performed, which will be described in detail below. Meanwhile, the metallic film 58 is formed over the plurality of terminals 56*a*. The metallic film 58 comes into contact with the metallic film 57, and the metallic film 57 is electrically connected to a ground wiring line among the plurality of FPC wiring lines 56. Thereby, the potential of each of the metallic films 57 and 58 is set to 0 V.

In addition, when the predetermined FPC wiring lines 56 are formed on a surface opposite to the currently provided surface through through-holes provided in the FPC 41, the metallic film 57 that is formed along the predetermined FPC wiring lines 56 is formed on a surface opposite to the surface on which the predetermined FPC wiring lines 56 are formed, that is, on the surface on which the FPC wiring lines 56 are already formed. That is, when the surface on which the predetermined FPC wiring lines 56 are formed is changed in the FPC 41, the metallic film 57 is formed on the surface opposite to the surface on which the FPC wiring lines 56 are formed after the change, in such a manner that it overlaps the predetermined wiring lines in plan view, and it is formed along the predetermined wiring lines.

Figure 5:
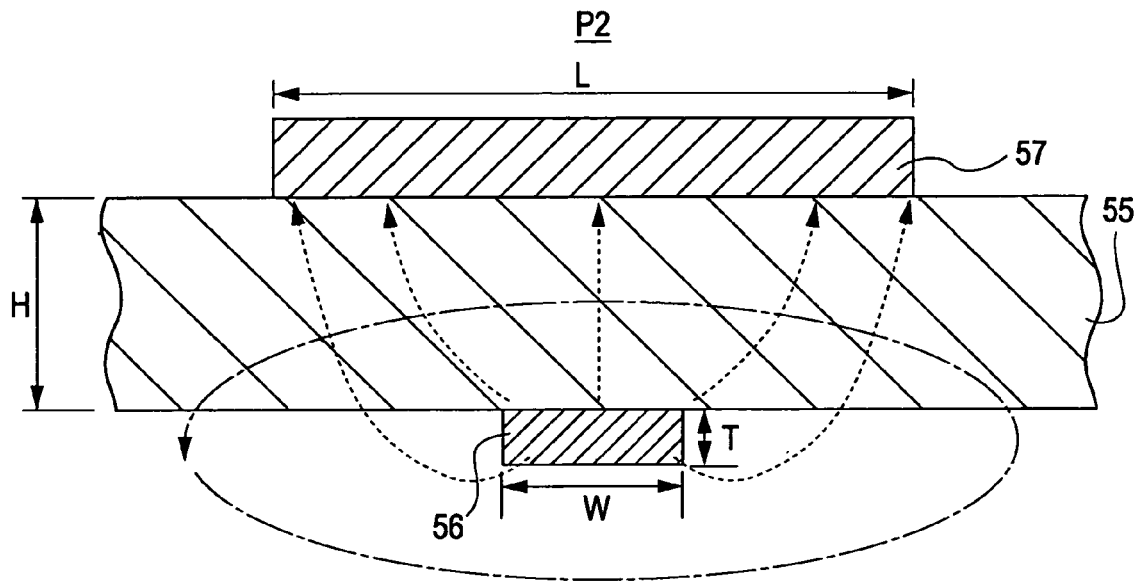
FIG. 5 is a cross-sectional view illustrating a structure of an FPC.

FIG. 5 is a cross-sectional view of a portion where one metallic film 57 is patterned in the FPC 41, that is, an enlarged view of a portion surrounded by the broken lines P2 in FIG. 4. As shown in FIG. 5, the metallic film 57 is formed on the surface opposite to the surface on which the FPC wiring lines 56 of the base film 55 is formed, along the FPC wiring lines 56. The width L of the metallic film 57 is larger than the width W of the FPC wiring line 56. As described above, since the potential of the metallic film 57 is always set to 0 V, it can be understood that the structure of the FPC 41 shown in FIG. 5 is a so-called microstrip line structure.

In FIG. 5, when the current flows through the wiring lines 56 from the interior side of the drawing to the front side of the drawing, a magnetic field is generated in an arrow direction of one-dot chain lines, and an electric field is generated in an arrow direction of broken lines. According to the microstrip line structure, since the metallic film 57 whose potential is always set to 0 V is disposed so as to be opposite to the FPC wiring line 56, as shown by broken lines in FIG. 5, the electric field orients to the metallic film 57. Thereby, the electric field generated by the FPC wiring line 56 can be suppressed from diverging. At this time, the electromagnetic wave propagated through the FPC wiring lines 56 becomes a so-called TEM wave (Transverse Electric Magnetic wave) in a plane perpendicular to a direction where the generated electric field and magnetic field orient, thereby preventing an electromagnetic wave from being leaked into peripheral portions. As a result, a loss of a high frequency wave component of a signal propagated through the FPC wiring line 56 can be prevented from being generated, and data transmission can be stably performed with a predetermined characteristic impedance. At this time, impedance Z (Ω) is determined by the pattern width W (inch) of the FPC wiring line 56, the thickness T (inch) of the FPC wiring line 56, the dielectric constant ∈ of the base film 55, and the thickness H (inch) of the base film 55, and is represented by Equation 1.

Equation 1

$$z = \frac{87}{\sqrt{\varepsilon + 1.41}} \ln \frac{5.98H}{0.8W + T} \quad (1)$$

In the above-mentioned high-speed data transmission, it is required that the high-frequency signal be also used and successfully transmitted. Accordingly, as described above, it is more effective that the metallic film 57 is patterned along the FPC wiring line 56 for performing high-speed data transmission. In this case, the width L of the metallic film 57 becomes at least three times the width W of the FPC wiring line 56. In this way, the metallic film 57 can sufficiently suppress divergence of the electric field generated by the FPC wiring line 56, and can prevent the loss of the high-frequency signal generated when the high-speed data transmission is performed. In addition, the metallic film 57 may be formed on not only the FPC wiring line 56 for performing high-speed data transmission but also the other FPC wiring lines 56.

Figure 6:
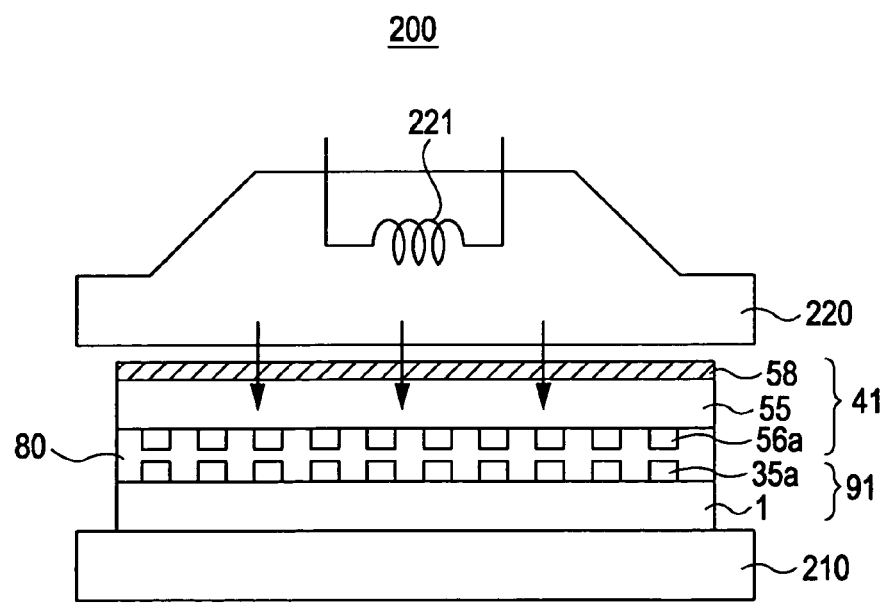
FIG. 6 is a cross-sectional view illustrating a state in which an FPC is mounted on an element substrate.

Further, as described above, in the FPC 41, the metallic film 58 is formed over all of the plurality of terminals 56*a*. That is, the terminal portion 41a is covered with the metallic film 58. By providing the metallic film 58, when the FPC 41 is pressurized on the element substrate 91 and then bonded to the element substrate through the ACF, irregularities of bonding can be removed. Hereinafter, a method of mounting the FPC 41 on the element substrate 91 will be described in detail. FIG. 6 is a cross-sectional view illustrating a state when the FPC 41 is mounted on the element substrate 91.

As shown in FIG. 6, when the FPC 41 is mounted on the element substrate 91, a thermal compression bonding device 200 is used which includes a stage 210 on which the element substrate 91 is mounted, a head 220 disposed above the stage 210, and a heater 221 built into the head 220.

In the thermal compression bonding device 200 constructed in this way, when the FPC 41 and the element substrate 91 are connected to each other through the ACF 80, the element substrate 91 is mounted on the stage 210, the ACF 80 is applied in a region where the terminals 35*a* are formed, and the FPC 41 is pressurized toward the element substrate 91 (direction shown by an arrow) using the head 220. Thereby, the terminal 56*a* of the FPC 41 is made to align with the terminal 35*a* of the element substrate 91.

In a state in which the head 220 presses the FPC 41 on the element substrate 91, the heater 221 is supplied with power and performs a heating process. As a result, the ACF 80, which is applied on the bonding surface between the FPC 41 and the element substrate 91 through the head 220, is heated, and a resin component of the ACF 80 is melted, and conductive particles contained in the ACF 80 are crushed between the terminal 35*a* of the element substrate 91 and the terminal 56*a* of the FPC 41, and the terminal 35*a* and the terminal 56*a* are electrically connected to each other. Then, if the ACF 80 cools, the resin component contained in the ACF 80 is solidified, and the element substrate 91 and the FPC 41 are bonded to each other.

As shown in FIG. 6, in the FPC 41 according to the embodiment of the invention, in the terminal portion 41a, the metallic film 58 is formed over substantially an entire surface that is opposite to the surface where the terminal 56*a* of the base film 55 is formed. In this way, the pressure applied when the head 220 presses on the FPC 41 can be uniformly applied to the entire surface of the terminal portion 41*a*, and thus the irregularities of the bonding with the ACF can be removed. When the metallic film 58 is not formed in the FPC 41 and the metallic film 57 is formed on the terminal portion 41*a*, the surface opposite to the surface where the terminal 56*a* of the base film 55 is formed becomes uneven due to the formation of the metallic film 57. Thereby, the head 220 cannot press the FPC 41 with uniform pressure, and thus the irregularities of bonding by the ACF are generated. The metallic film 58 is formed over substantially an entire surface of the terminal portion 41*a*. As a result, the loss of the high-frequency signal can be prevented, the FPC 41 can be uniformly pressed, and the element substrate 91 and the FPC 41 can be firmly bonded to each other.

Generally, in the FPC, when the wiring line is formed on the surface opposite to the surface where the terminal of the base film is formed, the opposite surface is precovered with a cover member that is formed of a polyimide resin or epoxy resin in order to prevent the wiring line from being corroded. In a method of mounting the general FPC and the element substrate, the FPC is mounted on the element substrate by using the thermal compression bonding device. In the FPC 41 according to this embodiment, the metallic film 58 is formed on the surface opposite to the surface on which the terminal of the base film is formed. The metallic film 58 is plated with gold (Au) or tin (Sn) so as to prevent corrosion. It is natural that the metallic film 58 formed of a metal such as copper is superior to the cover member formed of the plastic in terms of thermal conductivity. Accordingly, in the FPC 41 according to this embodiment other than the general FPC on which the cover member is provided, the heat of the heater of the thermal compression bonding device can be easily transmitted to the ACF. That is, when the FPC 41 according to this embodiment and the element substrate are bonded to each other, if the temperature of the heater 221 is lower than that when the general FPC and the element substrate are bonded to each other, sufficient heat can be transmitted to the ACF 80 at the time of bonding. In addition, in order to stop the metallic films 57 and 58 from being corroded, preferably, the surfaces of the metallic films 57 and 58 may not be plated with gold (Au) OR tin (Sn) but covered with a cover member.

FIG. 7 is a lateral view of the FPC 41. As described above, one end of the metallic film 57 comes into contact with the metallic film 58. In this case, the metallic film 57 is formed of only the FPC wiring line 56 in which the high-speed data transmission is performed. In addition, when the high-speed data transmission is performed over only a range from the IC 59 provided on the FPC 41 to the terminals 56a, the metallic film 57 is formed in only a range where the high-speed data transmission of the FPC wiring line 56 is performed, as shown in FIG. 7. At this time, the other end of the metallic film 57 is provided at a location where the IC 59 exists.

However, in this case, the other end of the metallic film 57 needs to be formed such that a location of the other end which is shifted from the front end of a bent portion P3 of the FPC 41 (a location shown by M1) to the element substrate 91 is at a location which is shifted from the a terminating end of the bent portion P3 (location shown by M2) to the main board of the electronic apparatus. When the other end of the metallic film 57 is formed in a range of the bent portion P3, stresses of the base film 55 are concentrated in the corresponding location, and the FPC wiring line 56 of the corresponding location may be cut. In addition, the other end of the metallic film 57 is preferably formed at a location which is deviated from the terminating end of the bent portion P3 of the FPC 41 (location shown by M2) to the main board of the electronic apparatus other than the location which is deviated from the front end of the bent portion P3 of the FPC 41 (location shown by M1) to the element substrate 91. If the FPC 41 is bent, the repulsive force with respect to the bent direction is generated in the base film 55. The metallic film 57 is formed over an entire surface of the bent portion P3, and thus the repulsive force generated in the base film 55 can be suppressed by the plastic deformation of the metallic film 57.

Figure 8A:
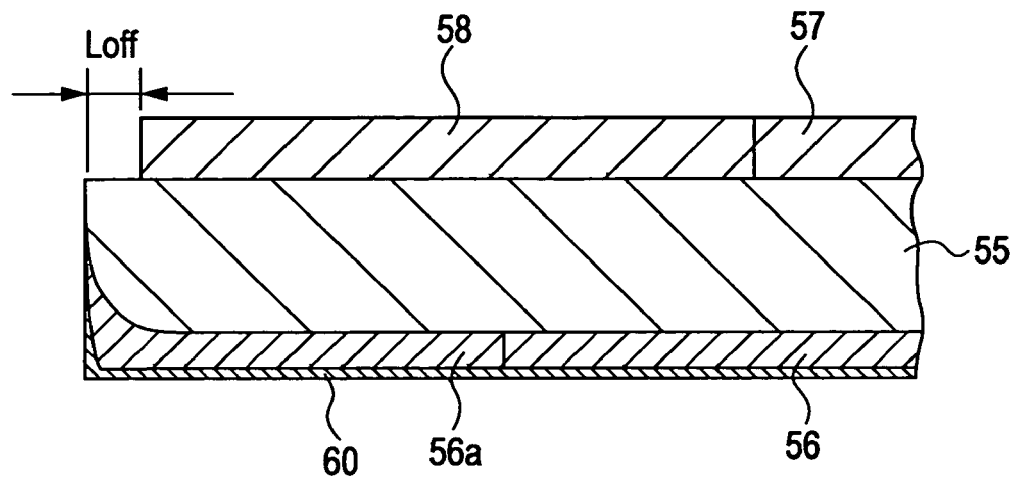
FIG. 8 is an enlarged view of a terminal portion of an FPC.
Figure 8B:
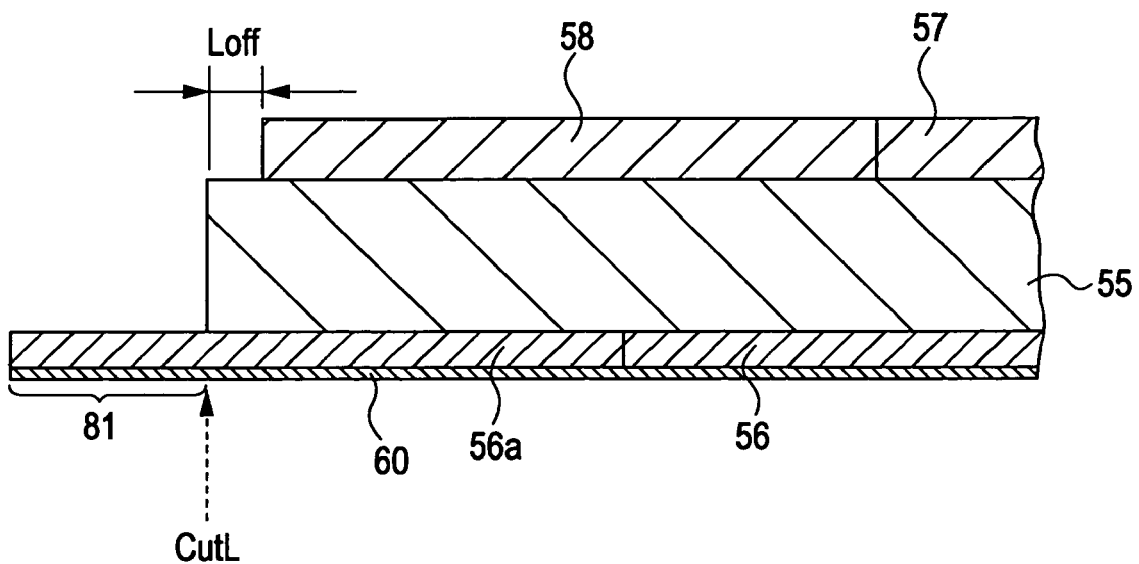

FIG. 8A is an enlarged view of the terminal portion 41a of the FPC 41. FIG. 7 is an enlarged view of a portion surrounded by broken lines P4. As shown in FIG. 8A, the metallic film 58 is formed so as to be more offset to the inside of the terminal than the end face of the base film 55 by the length Loff. On the surfaces of the terminal 56a and the FPC wiring line 56, a plating layer 60 that is plated with gold (Au) or the like is formed so as to prevent corrosion from occurring. Since electrical plating is performed as the plating, the electrode for supplying the current needs to be provided. For this reason, as shown in FIG. 8B, when the terminal 56a and the FPC wiring line 56 are plated, a portion that is called a plating lead 81 where the terminal 56a extends more than the end face of the base film 55 is preformed. The plating lead 81 functions as an electrode. The surfaces of the FPC wiring line 56 and the terminal 56a that contain the plating lead 81 are plated with gold, and thus the plating layer 60 is formed. After the plating layer 60 is formed on the surfaces of the terminal 56a and the FPC wiring line 56, it is cut along the end face of the base film 55 in a direction of an arrow CutL of one-dot broken lines, and thus the terminal portion 41a of the FPC 41 shown in FIG. 8A is formed.

However, as shown in FIG. 8A, the terminal 56a is bent along the end face of the base film 55 due to stresses occurring when the plating lead 81 is cut in a direction of an arrow CutL. For this reason, when the metallic film 58 is provided on the end face of the base film 55, the metallic film 58 and the terminal 56a come into contact with each other, and thus a short circuit may occur. In the FPC 41 according to this embodiment, the metallic film 58 is formed so as to be more offset to the inside of the terminal than the end face of the base film 55 by the length Loff, and thus the metallic film 58 and the terminal 56a can be prevented from coming into contact with each other and the short circuit occurs. In this case, the offset length Loff is preferably within a range of 50 to 300 μm.

Next, a method of manufacturing the FPC 41 according to the embodiment of the invention will be described. FIG. 9 is a diagram schematically illustrating a method of manufacturing the FPC 41.

Figure 9A:
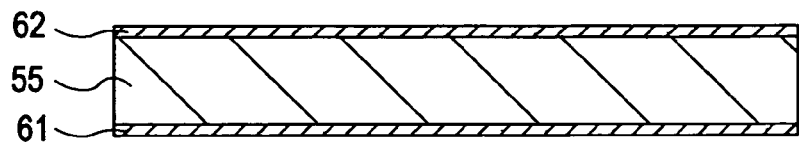
FIG. 9 is a diagram schematically illustrating a method of manufacturing an FPC.

First, as shown in FIG. 9A, copper foils 61 and 62 are formed on both sides of the base film 55 by using copper plating. This method is called a plating method. As a method of forming the copper foils 61 and 62 on both sides of the base film 55, a casting method, or a laminating method may be used instead of the plating method. According to the casting method, a polyimide resin having a paste shape is coated on a surface of the copper foil so as to cure it. According to the laminating method, the copper foil is thermally laminated on a composite film in which a hot-melt-type polyimide resin is thinly coated on the surface of the polyimide film becoming the base.

Figure 9B:
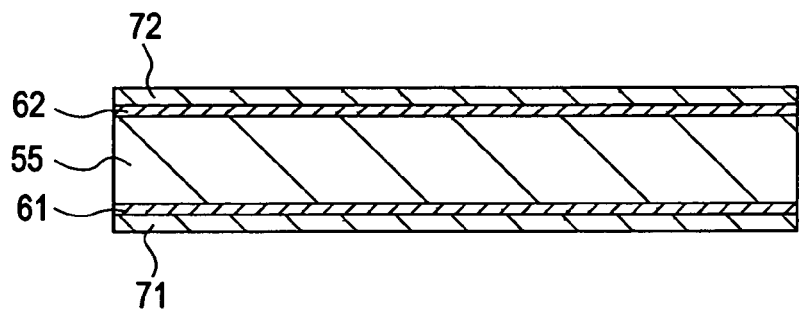
Figure 9C:
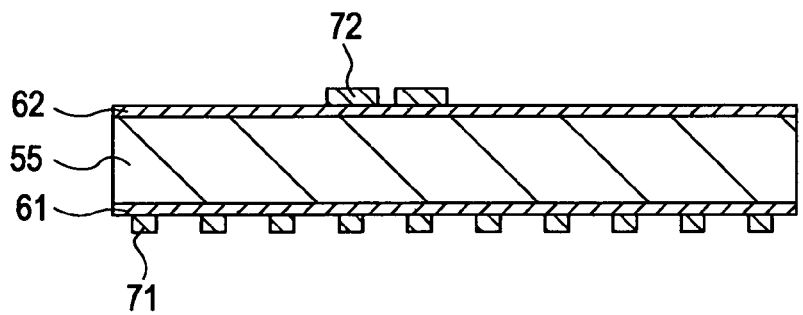
Figure 9D:
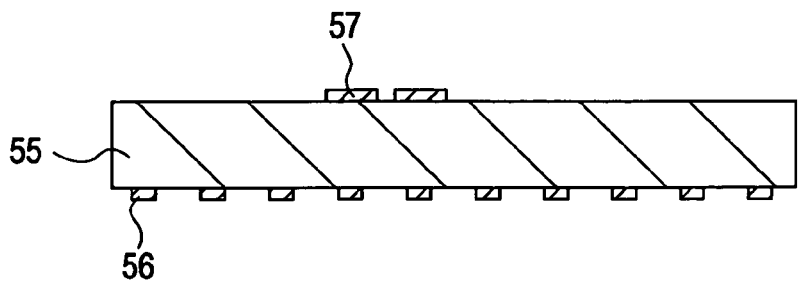

Next, dry films 71 and 72 in which a photosensitive resin is processed on a carrier film in a thin-film form are laminated on the surface of the copper foils 61 and 62 (FIG. 9B). By using photomasks and ultraviolet rays, the patterns of the FPC wiring line 56 and the terminal 56a are baked on the dry film 71 and the patterns of the metallic films 57 and 58 are baked on the dry film 72, and then a development process is performed thereon (FIG. 9C). Next, after copper foil etching is performed, an etching resist is removed, and the FPC wiring line 56 and the terminal 56a are formed on one surface of the base film 55, and the metallic films 57 and 58 are formed on the other surface of the base film 55 (FIG. 9D). In FIG. 9D, since the cross-sectional view of the FPC 41 is shown, only the FPC wiring line 56 and the metallic film 57 are shown.

In the method of manufacturing the FPC 41 according to this embodiment, the FPC wiring line 56, the terminal 56a, and the metallic films 57 and 58 are formed of copper. As shown in FIG. 9A, since the FPC is mainly sold in a state in which the copper foils 61 and 62 are formed on both sides of the base film 55, when the FPC wiring line 56, the terminal 56a, and the metallic films 57 and 58 are formed of copper, it is possible to reduce the number of the manufacturing processes. Accordingly, for example, if the metallic films 57 and 58 are formed by using another metal such as silver (Ag), silver foils instead of copper foils are formed on the surface of the base film 55, and the processes shown in FIGS. 9B to 9D may be performed. Through these manufacturing processes, not only the wiring lines of the FPC 41 but also the metallic film can be formed.

Modification

The FPC 41 according to this embodiment can be applied to the above-mentioned liquid crystal display device. In addition, it can be applied to another display device, such as an organic EL (electroluminescence) display device.

Electronic Apparatus

Next, an example in which the liquid crystal display device 100 according to the embodiment of the invention is used as a display device of an electronic apparatus will be described.

Figure 10:
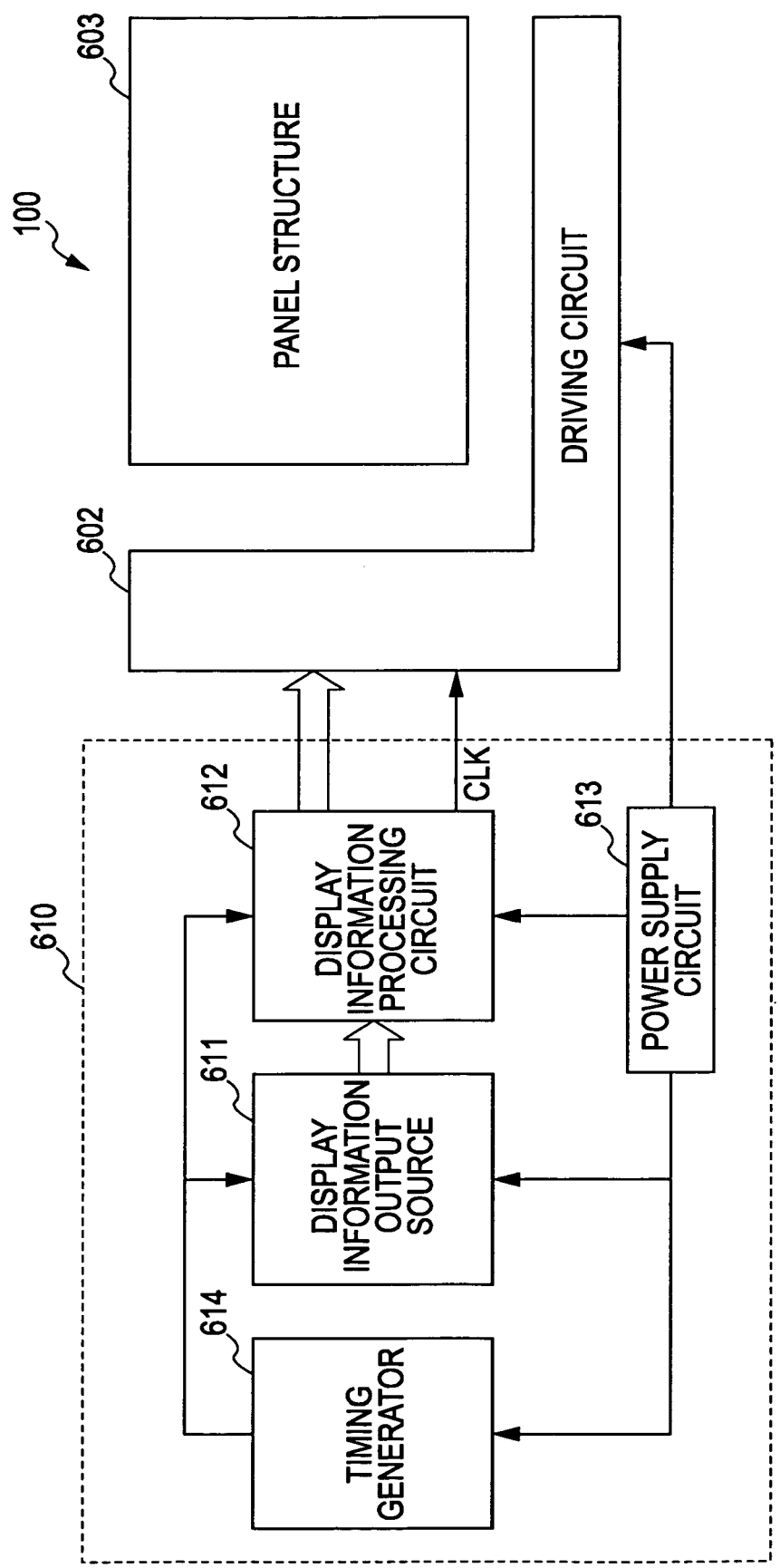
FIG. 10 is a circuit block diagram of an electronic apparatus to which a liquid crystal display device according to an embodiment of the invention is applied.

FIG. 10 is a diagram schematically illustrating an entire structure of this embodiment. The electronic apparatus that is illustrated in this example includes the above-described liquid crystal display device 100, and a control unit 610 that controls the liquid crystal display device 100. In addition, the control unit 610 is mounted on the main board of the above-mentioned electronic apparatus. In FIG. 10, the liquid crystal display device 100 is shown by conceptually dividing the liquid crystal display 100 into the panel structure 603 and a driving circuit 602 composed of a semiconductor IC or the like. Further, the control unit 610 includes a display information output source 611, a display information processing circuit 612, a power supply circuit 613, and a timing generator 614.

The display information output source 611 includes a memory that is composed of a ROM (Read Only Memory) or a RAM (Random Access Memory), a storage unit that is composed of a magnetic recording disk or an optical recording disk, a tuning circuit that tunes and outputs the digital image signal. The display information output source 611 is constructed such that the display information is supplied to the display information processing circuit 612 in a form of an image signal of a predetermined format on the basis of various clock signals that are generated by the timing generator 614.

The display information processing circuit 612 includes various circuits, such as a serial-parallel conversion circuit, an amplifying/inverting circuit, a rotation circuit, a gamma correction circuit, a clamp circuit or the like, and processes the input display information and supplies the image information to the driving circuit 602 together with the clock signal CLK through the FPC 41. The driving circuit 602 includes a scanning line driving circuit, a data line driving circuit, and a test circuit. In addition, the power supply circuit 613 supplies the predetermined voltage to the above-described respective constituent elements.

Next, a specific example of an electronic apparatus to which the liquid crystal display device 100 according to the embodiment of the invention can be applied will be described with reference to FIG. 11.

Figure 11A:
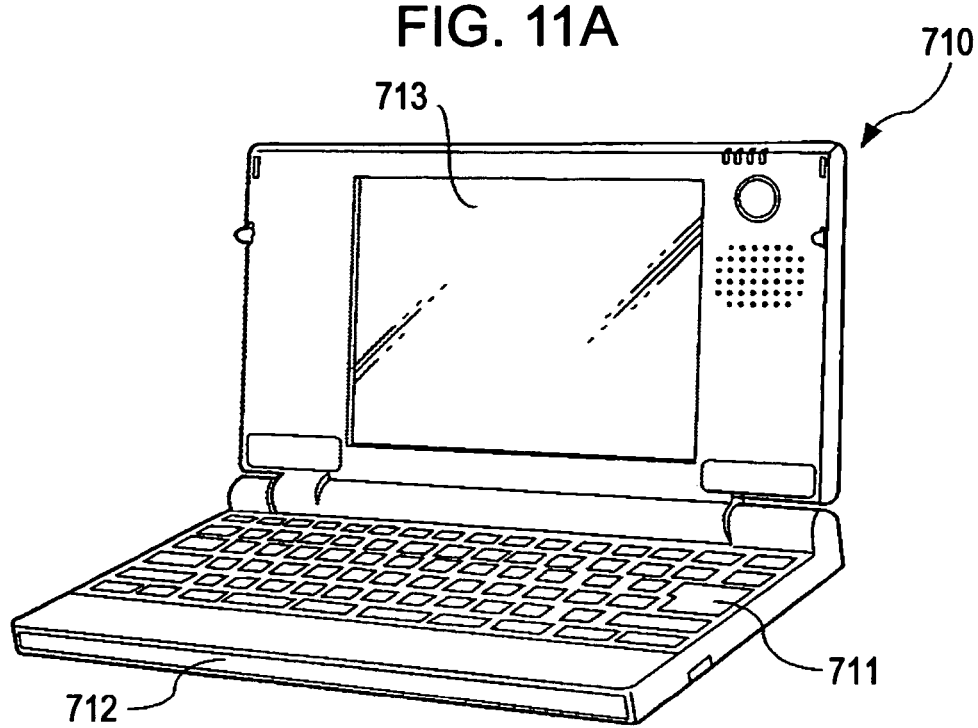
FIG. 11 is a diagram illustrating an example of an electronic apparatus where a liquid crystal display device according to an embodiment of the invention is applied.

1 First, an example in which the liquid crystal display device 100 according to the embodiment of the invention is applied to the display unit of the portable personal computer (so-called notebook-type personal computer) will be described. FIG. 11A is a perspective view illustrating a structure of a personal computer. As shown in FIG. 11A, the personal computer 710 includes a main body unit 712 that has a keyboard 711 and a display unit 713 to which the liquid crystal display device 100 according to the embodiment of the invention is applied.

Figure 11B:
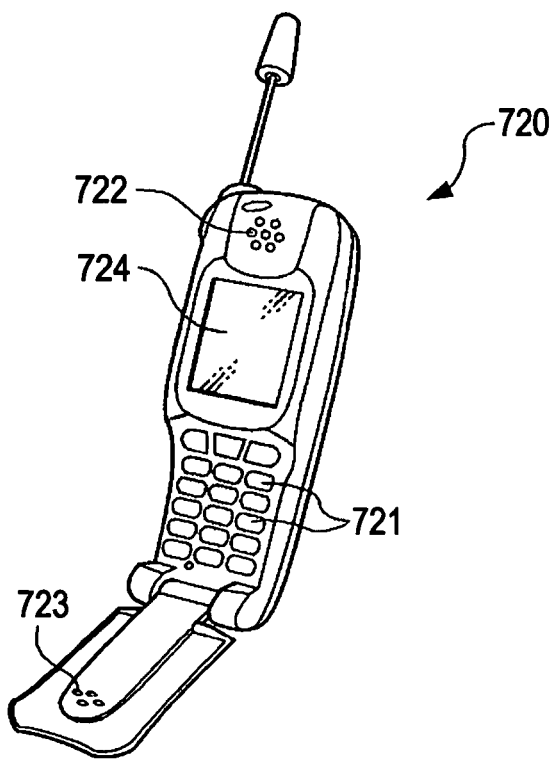

Next, an example in which the liquid crystal display device 100 according to the embodiments of the invention is applied to the display unit of the cellular phone will be described. FIG. 11B is a perspective view illustrating a structure of a cellular phone. As shown in FIG. 11B, the cellular phone 720 includes, in addition to a plurality of operation buttons 721, an earpiece 722, a mouthpiece 723, and a display unit 724 to which the liquid crystal display device according to the embodiments of the invention is applied.

In addition, examples of an electronic apparatus in which the liquid crystal display device 100 according to the embodiment of the invention can be used include, in addition to the personal computer shown in FIG. 11A and the cellular phone shown in FIG. 11B, a liquid crystal television, a view-finder-type or monitor-direct-view-type videotape recorder, a car navigation device, a pager, an electronic note, an electronic calculator, a word processor, a work station, a video phone, a POS terminal, a digital still camera or the like.

What is claimed is:

1. An electro-optical device, comprising:
   an electro-optical panel; and
   an interface board through which an image display signal for displaying an image to the electro-optical panel,
   the interface board including:
   a base film;
   a plurality of wiring lines that are disposed on one of the surfaces of the base film and that includes a wiring line for performing data transmission;
   a terminal connected to the wiring line for performing data transmission; and
   a conductive member that is formed on the other surface of the base film and that overlaps the wiring line for performing the data transmission in plan view, the conductive member being formed along the wiring line for performing data transmission,
   wherein the terminal is bent along an end face of the base films from the one of the surfaces of the base film, and
   wherein the conductive member is grounded and being inwardly offset from the end face of the base film, and
   wherein the terminal is electrically connected to a terminal formed on the electro-optical panel through an anisotropic conductive film.

2. The electro-optical device according to claim 1,
   wherein a width of the one of the conductive member is at least three times as that of the wiring line for performing data transmission.

3. The electro-optical device according to claim 1,
   wherein the wiring line for performing data transmission is a first wiring line that transmits a first signal,
   further comprising second wiring line for performing data transmission that transmits a second which is an inversion signal of the first signal.

4. An electronic apparatus, comprising a display unit being the electro-optical device according to claim 1.

5. The electro-optical device according to claim 3, further comprising:
   a plurality of external connecting wiring lines formed on the electro-optical panel; and
   a driver IC connected to the a plurality of external connecting wiring lines,
   wherein the plurality of external connecting wiring lines includes external connecting lines connected to the first and second wiring lines, respectively.

6. The electro-optical device according to claim 5, further comprising a resistor provided between the external connecting liens connected to first and second wiring lines, respectively.

7. The electro-optical devices according to claim 1, wherein the conductive member is offset from the end face of the base film between 50 µm and 300 µm.

8. The electro-optical device according to claim 1, wherein the wiring line for performing data transmission is formed on the other surface of the base film via a through hole formed to the base film, further comprising another conductive member that is formed on the one of the surface of the base film and that overlaps the wiring line of the other surface of the base film in plain view, the other conductive member being formed along the wiring line of the other surface of the base film.

\* \* \* \* \*